(12) United States Patent  (10) Patent No.: US 7,863,134 B2
Hamamura et al.  (45) Date of Patent: Jan. 4, 2011

(54) NONVOLATILE SEMICONDUCTOR STORAGE DEVICE AND MANUFACTURING METHOD THEREOF

(75) Inventors: Hirotaka Hamamura, Kodaira (JP); Itaru Yanagi, Kunitachi (JP); Toshiyuki Mine, Fussa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 12/695,271

(22) Filed: Jan. 28, 2010

(65) Prior Publication Data

US 2010/0129998 A1 May 27, 2010

Related U.S. Application Data

(62) Division of application No. 12/186,488, filed on Aug. 5, 2008, now Pat. No. 7,719,051.

(30) Foreign Application Priority Data

Sep. 10, 2007 (JP) .............................. 2007-233924

(51) Int. Cl.
*H01L 21/336* (2006.01)
(52) U.S. Cl. ................ 438/257; 438/261; 257/E21.179; 257/E21.18; 257/E21.422
(58) Field of Classification Search ................. 438/257, 438/261; 257/E21.179, E21.18, E21.422
See application file for complete search history.

(56) References Cited

U.S. PATENT DOCUMENTS 6,969,885 B2  11/2005  Omi et al.
7,405,125 B2  7/2008  Wang
2003/0194853 A1  10/2003  Jeon (Continued)

FOREIGN PATENT DOCUMENTS

JP  2004-158810 A  6/2004

(Continued)

OTHER PUBLICATIONS

Wang et al. "Fast erasing and highly reliable MONOS type memory HfO$_2$ high-$k$ trapping layer and Si$_3$N$_4$/SiO$_2$ tunneling stack", Technical Digest of IEDM, 2006, p. 971.

(Continued)

*Primary Examiner*—Ngan Ngo
(74) *Attorney, Agent, or Firm*—Miles & Stockbridge P.C.

(57) ABSTRACT

A charge holding insulating film in a memory cell is constituted by a laminated film composed of a bottom insulating film, a charge storage film, and a top insulating film on a semiconductor substrate. Further, by performing a plasma nitriding treatment to the bottom insulating film, a nitride region whose nitrogen concentration has a peak value and is 1 atom % or more is formed on the upper surface side in the bottom insulating film. The thickness of the nitride region is set to 0.5 nm or more and 1.5 nm or less, and the peak value of nitrogen concentration is set to 5 atom % or more and 40 atom % or less, and a position of the peak value of nitrogen concentration is set within 2 nm from the upper surface of the bottom insulating film, thereby suppressing an interaction between the bottom insulating film and the charge storage film.

8 Claims, 9 Drawing Sheets

U.S. PATENT DOCUMENTS

| | | |
|---|---|---|
| 2004/0119111 A1 | 6/2004 | Omi et al. |
| 2005/0266637 A1 | 12/2005 | Wang |
| 2006/0022252 A1 | 2/2006 | Doh et al. |
| 2007/0218606 A1* | 9/2007 | Ozawa et al. ............... 438/165 |
| 2007/0241390 A1 | 10/2007 | Tanaka et al. |
| 2008/0093658 A1 | 4/2008 | Shiozawa et al. |
| 2008/0286919 A1 | 11/2008 | Goda |
| 2009/0072327 A1 | 3/2009 | Kitagawa et al. |
| 2009/0269894 A1* | 10/2009 | Ozawa et al. ............... 438/264 |

OTHER PUBLICATIONS

Huo et al. "Band Engineered Charge Trap Layer for highly Reliable MLC Flash Memory", VLSI Technology Digest, 2007, p. 138.

* cited by examiner

NONVOLATILE SEMICONDUCTOR STORAGE DEVICE AND MANUFACTURING METHOD THEREOF

CROSS-REFERENCE TO RELATED APPLICATION

This application is a division of application Ser. No. 12/186,488 filed Aug. 5, 2008, now U.S. Pat. No 7,719,051. The present application also claims priority from Japanese Patent Application No. JP 2007-233924 filed on Sep. 10, 2007, the content of which is hereby incorporated by reference into this application.

TECHNICAL FIELD OF THE INVENTION

The present invention relates to an electrically writable and erasable nonvolatile semiconductor storage device and a manufacturing method of the same. In particular, it relates to a technology effectively applied to a nonvolatile semiconductor storage device having a memory unit composed of a MONOS (Meal Oxide Nitride Oxide Semiconductor) memory cell having a metal oxide film as a charge storage film.

BACKGROUND OF THE INVENTION

An EEPROM (Electrical Erasable and Programmable Read Only Memory) has been widely used as an electrically writable and erasable nonvolatile semiconductor storage device. A memory unit of such a nonvolatile semiconductor storage device represented by a flash memory is composed of a plurality of nonvolatile memory cells, and for example, a field-effect transistor that has a conductive floating gate electrode or a trap insulating film surrounded by oxide films below a gate electrode and stores information by holding electric charge in the floating gate electrode or the trap insulating film is used in this nonvolatile memory cell. A memory holding state of the floating gate electrode or the trap insulating film can be read out by the change of a threshold voltage of the field-effect transistor.

The trap insulating film is referred to as an insulating film capable of holding electric charge, and for example, a silicon nitride film can be cited as an example. The nonvolatile memory cell using a silicon nitride film as a charge storage film is referred to as a MONOS memory cell, and since it discretely stores the electric charge, the reliability of holding information is excellent as compared with the nonvolatile memory cell that stores the electric charge in the floating gate electrode. Also, in the MONOS memory cell, it is necessary to form an oxide film above and below the silicon nitride film in order to suppress the leakage of held electric charge. However, since the reliability of holding information is excellent, the oxide films can be made thin. For example, a thin oxide film of 8 nm or less can be applied, so that low voltage writing and erasing operations can be achieved.

However, in the MONOS memory cell using a silicon nitride film for the charge storage film, it is difficult to say that both of a charge capture characteristic and a charge holding characteristic are sufficient, and for example, the MONOS memory cell using a metal oxide film such as alumina instead of a silicon nitride film for the charge storage film has been proposed.

For example, the nonvolatile semiconductor memory cell in which the metal oxide film such as alumina is applied to the charge storage film in order to improve the charge holding characteristic is disclosed in Japanese Patent Application Laid-Open Publication No 2004-158810 (Patent Document 1). Also, a technology of improving a dielectric constant of a metal oxide film by applying heat treatment to the film immediately after the metal oxide film is formed is disclosed in the specification of US Patent application publication No. 2006/0022252 (Patent Document 2). This heat treatment is generally performed after the metal oxide film is formed. Further, a technology in which a laminated film of a silicon oxide film and a silicon nitride film (a laminated structure in which a silicon nitride film is stacked on a silicon oxide film) is formed between a substrate and a metal oxide film in order to speed up the erasing operation is proposed (see Technical Digest of IEDM, 2006, p. 971 (Non-Patent Document 1)). Furthermore, a technology in which a device operation window is expanded by using a laminated structure of an alumina film and silicon nitride films (bottom silicon nitride film/alumina film/top silicon nitride film) for a charge storage film is proposed (see VLSI Technology Digest, 2007, p. 138 (Non-Patent Document 2)).

SUMMARY OF THE INVENTION

However, with respect to the MONOS memory cell using a metal oxide film for the charge storage film, there exist various technical problems as follows.

The studies by the inventors of the present invention have revealed that, in the case of a charge holding insulating film in which a metal oxide film is adopted for the charge storage film and this meal oxide film is sandwiched by oxide films, due to the heat treatment (for example, the heat treatment immediately after depositing the metal oxide film or the heat treatment for impurity activation and the like) after forming the metal oxide film, the reaction occurs between the metal oxide film and a top oxide film in contact with an upper surface of the metal oxide film or a bottom oxide film in contact with a lower surface thereof. When such a reaction occurs, metal elements of the metal oxide film are diffused into the top oxide film or the bottom oxide film, so that electrons move toward the gate electrode or the substrate through the metal elements present in the top oxide film or the bottom oxide film. As a result, a problem arises that the charge holding characteristic of the memory cell is deteriorated.

The structure in which the metal oxide film and the oxide films are in direct contact is shown in, for example, Patent Documents 1 and 2. In a fifth embodiment disclosed in Patent Document 1, the laminated film of a silicon nitride film and an alumina film is used for a trap film and the laminated film of a silicon oxide film and a $La_2O_5$ film is used for a bottom oxide film. In this structure, since the silicon oxide film and the $La_2O_5$ film which is the metal oxide film are in direct contact, La is diffused into the silicon oxide film by the heat treatment in a later process and the charge holding characteristic of the memory cell is deteriorated.

Patent Document 2 discloses a structure in which a metal oxide film is used for the charge storage film and the bottom silicon oxide film and the metal oxide film are in direct contact. Although it is disclosed in the embodiment that the heat treatment is performed immediately after the formation of the metal oxide film in order to improve a dielectric constant of the metal oxide film, as described above, the metal elements of the metal oxide film are diffused into the bottom silicon oxide film when the heat treatment is performed, and therefore the charge holding characteristic of the memory cell is deteriorated.

In Non-Patent Documents 1 and 2, a silicon nitride film is formed between a metal oxide film and a bottom silicon oxide film. Non-Patent Document 1 proposes a technology that a silicon nitride film with a thickness of 1.6 nm is deposited on the bottom silicon oxide film by a CVD method to form the laminated film of the bottom silicon oxide film and the silicon nitride film, thereby speeding up the device erasing operation. However, it is difficult to uniformly form the silicon nitride film with a thickness of 1.6 nm by the CVD method on a wafer surface with good reproducibility, and there arises a problem of a control of the thickness of the silicon nitride film.

Non Patent Document 2 proposes that the laminated film obtained by sandwiching an alumina film by silicon nitride films (bottom silicon nitride film (3 nm)/alumina film (3 nm)/top silicon nitride film (4 nm)) is used for the charge storage film, thereby expanding the device operation window. However, in the case of this structure, since an electric film thickness of the charge storage film becomes approximately 5 nm, a device operation voltage cannot be lowered. Although it is possible to reduce the electric film thickness of the whole charge storage film by thinning the silicon nitride film, in this case, it is necessary to form the silicon nitride film with a thickness of 3 nm or less by the CVD method. Therefore, as described above, it is difficult to uniformly form the silicon nitride film by the CVD method on a wafer surface with good reproducibility, and there arises a problem of a control of the thickness of the silicon nitride film.

An object of the present invention is to provide a technology capable of improving a charge holding characteristic of a nonvolatile memory cell using a metal oxide film for a charge storage film by suppressing mutual diffusion between the metal oxide film and the insulating films sandwiching the metal oxide film.

The above and other objects and novel characteristics of the present invention will be apparent from the description of this specification and the accompanying drawings.

The typical ones of the inventions disclosed in this application will be briefly described as follows.

The nonvolatile semiconductor storage device according to the present invention comprises a memory cell including a charge holding insulating film constituted by sequentially stacking a bottom insulating film, a charge storage film composed of a metal oxide film, and a top insulating film from a channel region side of a semiconductor substrate, wherein nitride regions whose nitrogen concentration has a peak value and is 1 atom % or more are formed on a charge storage film side in the bottom insulating film and on a top insulating film side in the charge storage film, and in the nitride region formed on the charge storage film side in the bottom insulating film, for example, a thickness thereof is set to 0.5 nm or more and 1.5 nm or less and the peak value of nitrogen concentration is set to 5 atom % or more and 40 atom % or less, and a position of the peak value of nitrogen concentration is set to an area within 2 nm from an interface between the bottom insulating film and the charge storage film.

A manufacturing method of a nonvolatile semiconductor storage device according to the present invention comprises the steps of: forming a bottom insulating film on a semiconductor substrate; performing a plasma nitriding treatment to the bottom insulating film, thereby forming a nitride region whose nitrogen concentration has a peak value and is 1 atom % or more on an upper surface side in the bottom insulating film; forming a charge storage film composed of a metal oxide film on the bottom insulating film; performing a plasma nitriding treatment to the charge storage film, thereby forming a nitride region whose nitrogen concentration has a peak value and is 1 atom % or more on an upper surface side in the charge storage film; forming a top insulating film on the charge storage film; and forming a gate electrode on the top insulating film, wherein, in the nitride region formed on the charge storage film side in the bottom insulating film, for example, a thickness thereof is set to 0.5 nm or more and 1.5 nm or less and the peak value of nitrogen concentration is set to 5 atom % or more and 40 atom % or less, and a position of the peak value of nitrogen concentration is set to an area within 2 nm from an interface between the bottom insulating film and the charge storage film.

The effects obtained by typical aspects of the present invention will be briefly described below.

In the charge holding insulating film constituted by sequentially stacking a bottom insulating film, a charge storage film composed of a metal oxide film, and a top insulating film, nitride regions are formed on the upper surface side in the bottom insulating film and on the upper surface side in the charge storage film by the plasma nitriding treatment, so that a mutual diffusion between the bottom insulating film and the charge storage film or between the charge storage film and the top insulating film is suppressed, and the diffusion of the metal elements to the bottom insulating film or the top insulating film can be prevented. As a result, the charge holding characteristic of the nonvolatile memory cell using the metal oxide film for the charge storage film can be improved.

DESCRIPTIONS OF THE PREFERRED EMBODIMENTS

In the embodiment described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiment described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable. Further, in the embodiment described below, it goes without saying that, the components (including element steps) are not always indispensable unless otherwise stated or except the case where the components are apparently indispensable in principle. Similarly, in the embodiment described below, when the shape of the components, positional relation thereof, and the like are mentioned, the substantially approximate and similar shapes and the like are included therein unless otherwise stated or except the case where it can be conceived that they are apparently excluded in principle. The same goes for the numerical value and the range described above.

Further, in the present embodiment, a MISFET (Metal Insulator Semiconductor Field Effect Transistor) representing a field-effect transistor is abbreviated as a MIS, and an n channel type MISFET is abbreviated as an nMIS. The MOSFET (Metal Oxide Semiconductor FET) is a field-effect transistor with a structure whose gate insulating film is composed of a silicon oxide ($SiO_2$ and the like) film, and it is contained in the subordinate concept of the MIS. Needless to mention, the MONOS memory cell described in the present embodiment is also contained in the subordinate concept of the MIS. Further, in the present embodiment, when reference is made to a wafer, it mainly indicates an Si (silicon) single crystal wafer but it is not limited to this, and it also indicates an SOI (Silicon On Insulator) wafer, an insulating film substrate for forming an integrated circuit thereon and others. Its shape is also not limited to circular or nearly circular, and a square or rectangle shape and the like are available.

Also, components having the same function are denoted by the same reference numbers throughout the drawings for describing the embodiments, and the repetitive description thereof will be omitted. Hereinafter, embodiments of the present invention will be described in detail with reference to the accompanying drawings.

Figure 1:
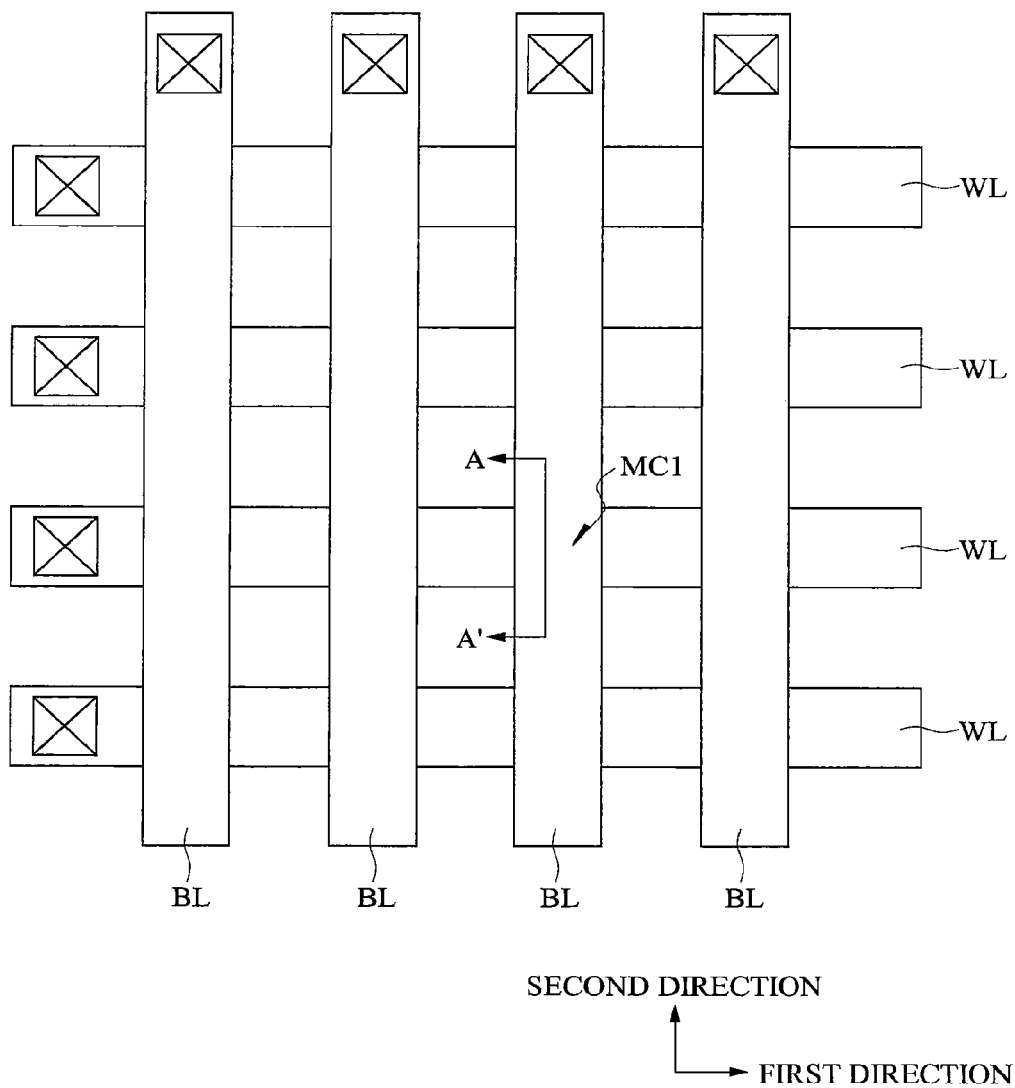
FIG. 1 is a plan layout view of word lines and bit lines showing a configuration of a memory array using a MONOS memory cell with a single gate structure according to an embodiment of the present invention.

An example of a memory unit of a nonvolatile semiconductor storage device according to an embodiment of the present invention will be described with reference to FIG. 1 and FIG. 2. FIG. 1 is a plan layout view of word lines and bit lines showing a configuration of a memory array using a MONOS memory cell with a single gate structure, FIG. 2A is a cross sectional view showing the principal part of the memory cell in which the MONOS memory cell with a signal gate structure is cut along a gate length direction (line A-A' of FIG. 1), and FIG. 2B is a cross sectional view showing the principal part of the charge holding insulating film in which a region B of FIG. 2A is shown in an enlarged manner.

The memory unit of the nonvolatile semiconductor storage device is constituted by a memory array in which memory cells MC1 are disposed in a two-dimensional lattice shape. As shown in FIG. 1, in this memory array, a plurality of word lines WL which are signal lines extend in parallel in a first direction, and a plurality of bit lines BL which are the other signal lines extend in parallel in a second direction which is a direction intersecting with the first direction. A memory gate electrode of each memory cell MC1 is connected to the word line WL, and a drain region of each memory cell MC1 is connected to the bit line BL.

Figure 2A:
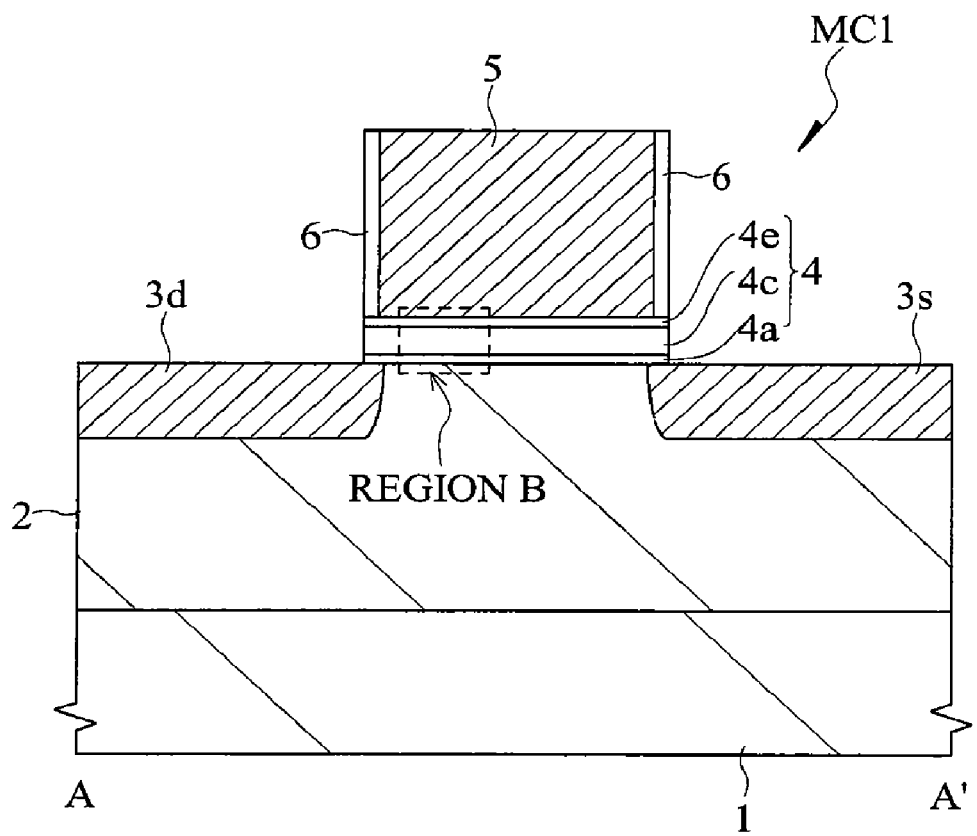
FIG. 2A is a cross sectional view showing the principal part of a memory cell in which the MONOS memory cell with the single gate structure is cut along a gate length direction according to an embodiment of the present invention.

As shown in FIG. 2A, the memory cell MC1 is composed of the nMIS having a p well 2 formed on the main surface of the semiconductor substrate 1, an $n^+$ type semiconductor region to be a source region 3s, an $n^+$ type semiconductor region to be a drain region 3d, a charge holding insulating film 4 formed on a channel region between the source region 3s and the drain region 3d, and a memory gate electrode 5 formed on the charge holding insulating film 4. The charge holding insulating film 4 is constituted of a laminated film obtained by sequentially forming a bottom insulating film (first insulating film) 4a, a charge storage film 4c, and a top insulating film (second insulating film) 4e from a channel region side. The bottom insulating film 4a and the top insulating film 4e are composed of, for example, a silicon oxide film, and the charge storage film 4c is composed of, for example, a metal oxide film such as a hafnium oxide film. The thickness of the bottom insulating film 4a is 2.5 nm or more and 6 nm or less, the thickness of the top insulating film 4e is 4 nm or more and 6 nm or less, and the thickness (physical film thickness without considering a dielectric constant) of the charge storage film 4c is 20 nm or less. Further, the memory gate electrode 5 is composed of, for example, a polycrystalline silicon film to which an n type impurity is introduced, and it constitutes the word line WL.

Figure 2B:
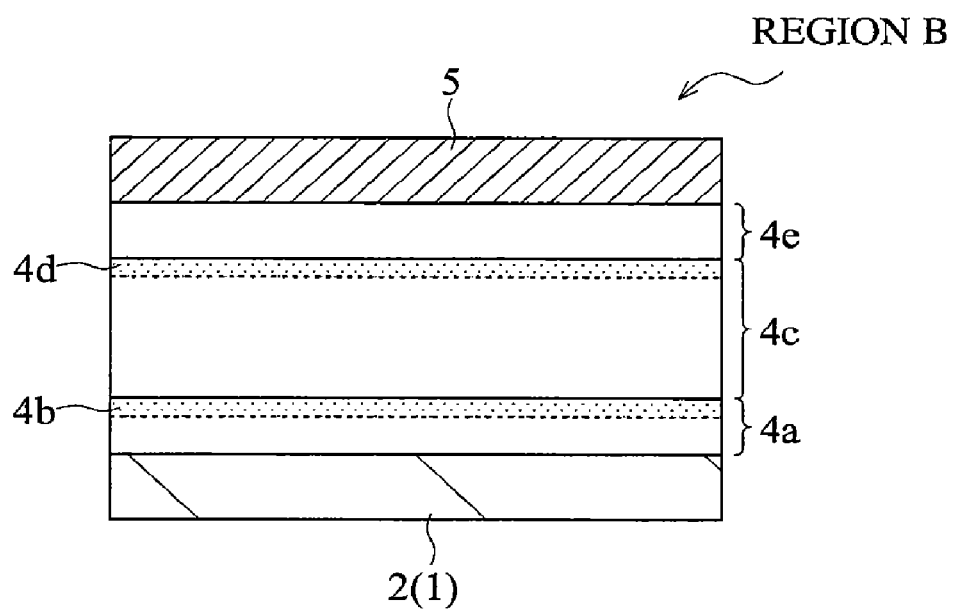
FIG. 2B is a cross sectional view showing the B region in FIG. 2A in an enlarged manner.

Furthermore, as shown in FIG. 2B, a nitride region 4b whose nitrogen concentration has a peak value and is 1 atom % or more is formed on the charge storage film 4c side in the bottom insulating film 4a, and the thickness of the nitride region 4b is 0.5 nm or more and 1.5 nm or less. The peak value of nitrogen concentration in the nitride region 4b is 5 atom % or more and 40 atom % or less, and it is located within 2 nm from the interface between the bottom insulating film 4a and the charge storage film 4c. Further, a nitride region 4d whose nitrogen concentration has a peak value and is 1 atom % or more is formed on the top insulating film 4e side in the charge storage film 4c. The peak value of nitrogen concentration in the nitride region 4d is 5 atom % or more and 40 atom % or less.

In the memory cell MC1, the nitride region 4b having nitrogen concentration of 1 atom % or more is formed on the charge storage film 4c side in the bottom insulating film 4a and the nitride region 4d having nitrogen concentration of 1 atom % or more is formed on the top insulating film 4e side in the charge storage film 4c, but it is also possible to form the nitride region 4b only on the charge storage film 4c side in the bottom insulating 4a without forming the nitride region 4d on the top insulating film 4e side in the charge storage film 4c. Though a description will be made with reference to evaluation results (for example, charge holding characteristic of the memory cell shown in FIG. 8) later, even when the nitride region 4b is formed only on the charge storage film 4c side in the bottom insulating film 4a, the effect of improving the data holding characteristic of the memory cell can be achieved.

Figure 3:
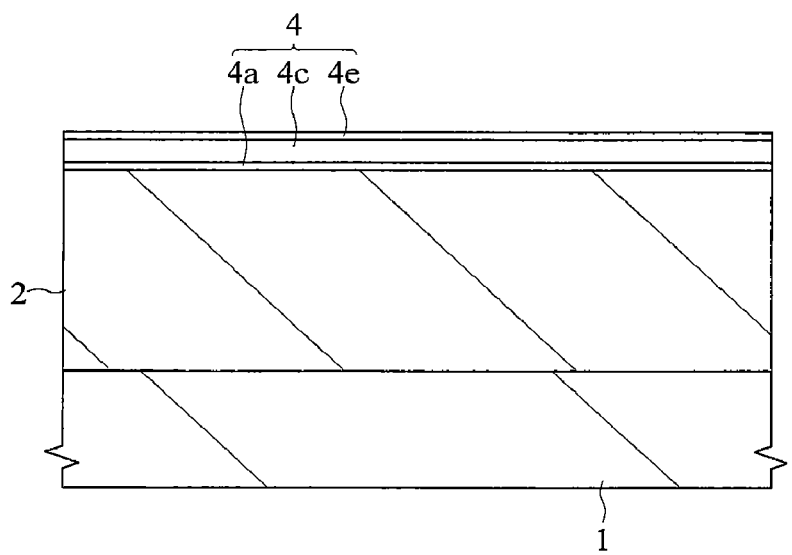
FIG. 3 is a cross sectional view showing the principal part during the manufacturing process of the MONOS memory cell with the single gate structure according to an embodiment of the present invention.
Figure 4:
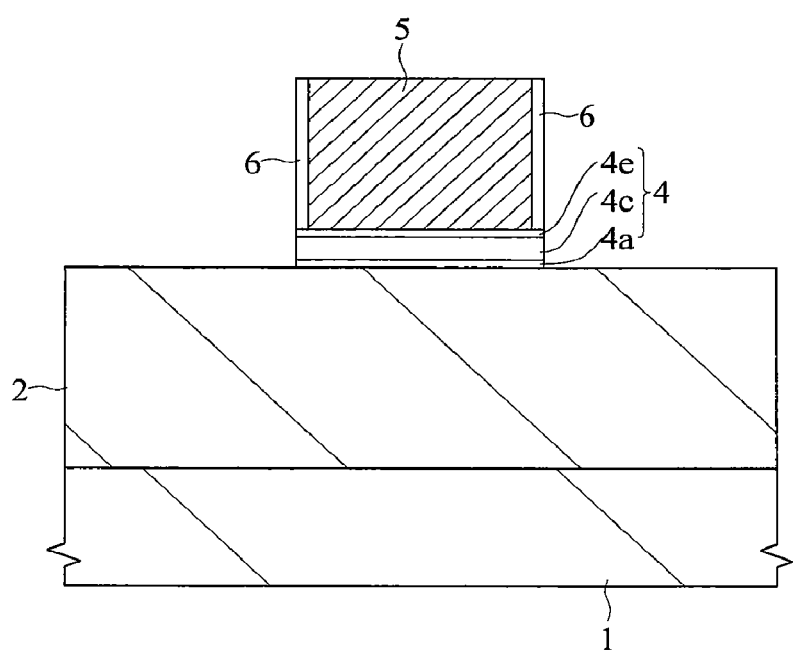
FIG. 4 is a cross sectional view showing the principal part of the same region as FIG. 3 during the manufacturing process of the MONOS memory cell continued from FIG. 3.
Figure 5:
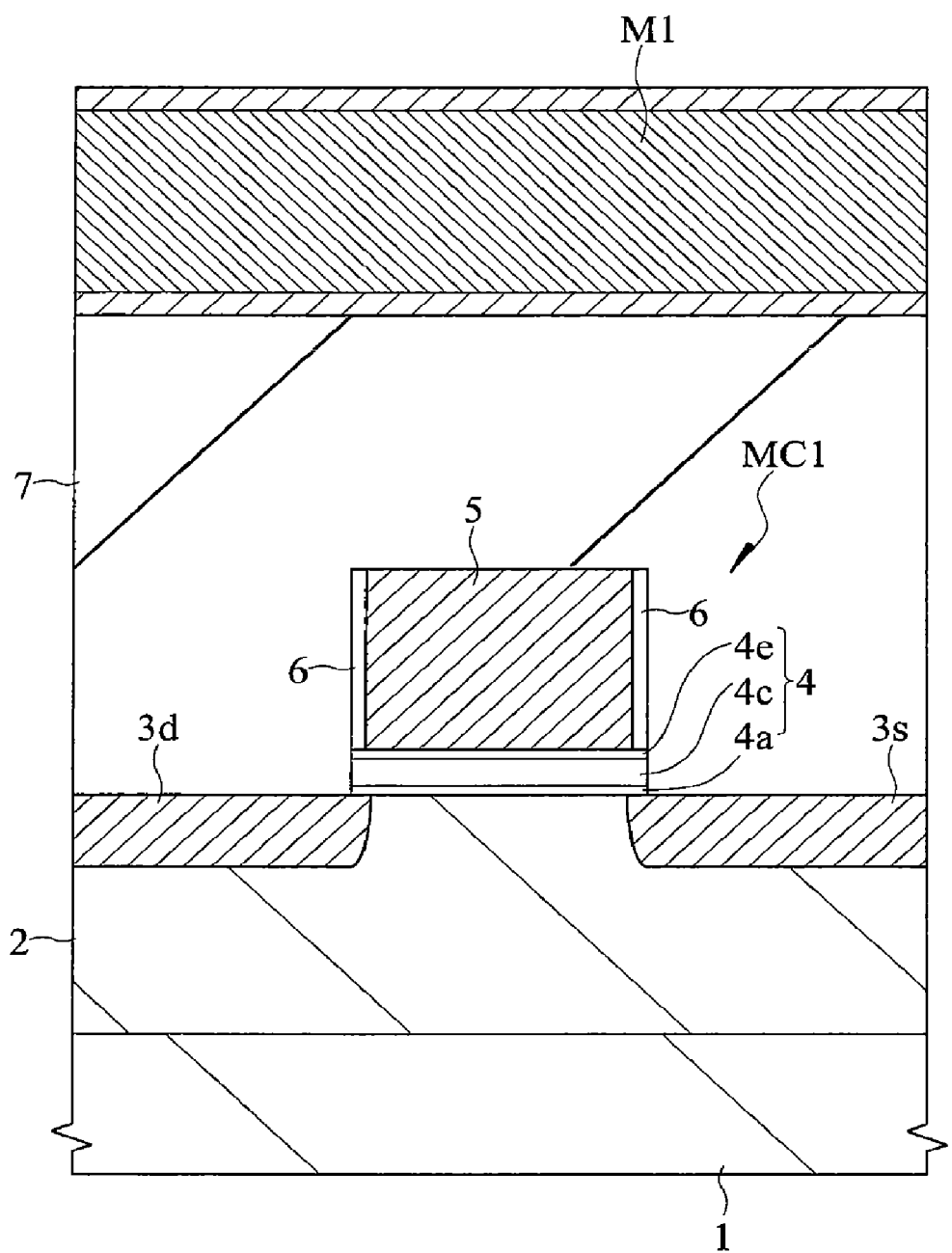
FIG. 5 is a cross sectional view showing the principal part of the same region as FIG. 3 during the manufacturing process of the MONOS memory cell continued from FIG. 4.

Next, an example of the manufacturing method of the MONOS memory cell with a single gate structure according to an embodiment of the present invention will be described with reference to FIGS. 3 to 5. FIGS. 3 to 5 are cross sectional views showing the principal part of the memory cell in the manufacturing process of the memory cell.

First, as shown in FIG. 3, for example, a semiconductor substrate 1 (at this stage, a thin plate of semiconductor in an approximately circular shape in plane referred to as a semiconductor wafer) made of a p type single crystal silicon having specific resistance of 1 to 10 Ω·cm is prepared. Subsequently, trench element isolation portions and active regions surrounded by the isolation portions are formed in a main surface of the semiconductor substrate 1. More specifically, after forming isolation trenches at predetermined positions of the semiconductor substrate 1, an insulating film made of, for example, silicon oxide is deposited on the main surface of the semiconductor substrate 1, and then, the insulating film is polished by a CMP (Chemical Mechanical Polishing) method and the like so that the insulating film is left only inside the isolation trenches, thereby forming the isolation portions. Subsequently, a p type impurity is selectively introduced into the predetermined portion of the semiconductor substrate 1 with the predetermined energy by the ion-implantation method or the like, thereby forming the p well 2.

Next, by performing dry oxidation at 850° C. to the semiconductor substrate 1, the bottom insulating film 4a having a thickness of, for example, 2.5 nm or more and 6 nm or less composed of a silicon oxide film is formed on the main surface of the semiconductor substrate 1. The formation of the bottom insulating film 4a is not limited to this, and it can be formed by, for example, wet oxidation, ISSG (In-Situ Stream Generation) oxidation, ozone oxidation or plasma oxidation.

Further, a silicon oxynitride film may be used for the bottom insulating film 4a, and by using the silicon oxynitride film, the reliability of the bottom insulating film 4a can be improved. The silicon oxynitride film can be formed by, for example, applying heat treatment to the semiconductor substrate 1 having the silicon oxide film formed on the main surface thereof in nitrogen atmosphere using nitrogen monoxide (NO) gas or dinitrogen monoxide ($N_2O$) gas and the like. For example, by performing the thermal treatment for ten minutes at the temperature of 900° C. to the semiconductor substrate 1 in the atmosphere of nitrogen monoxide (NO) gas diluted to 10% by nitrogen, the silicon oxynitride film to which nitrogen of about 3 atom % is introduced can be formed at the interface between the semiconductor substrate 1 and the silicon oxide film.

Next, the bottom insulating film 4a is nitrided by a plasma nitriding treatment using nitrogen gas, and a nitride region (the nitride region 4b shown in FIG. 2B) is formed on the upper surface side in the bottom insulating film 4a. As described above, the nitride region 4b has nitrogen concentration of 1 atom % or more, and its thickness is 0.5 nm or more and 1.5 nm or less. Also, the peak value of nitrogen concentration in the nitride region 4b is 5 atom % or more and 40 atom % or less, and the peak value is located within 2 nm from the upper surface of the bottom insulating film 4a. Although the nitrogen gas is used for the process gas, the process gas is not limited to the nitrogen gas, and for example, ammonium gas ($NH_3$) may be used, and further, a mixed gas of nitrogen and noble gas or a mixed gas of ammonium gas and noble gas may be used. For example, a process temperature in the plasma nitriding treatment is 600° C., a process pressure is 50 Pa, and an RF power is 250 W. These process temperature, process pressure and RF power are mere examples and not limited thereto.

Next, the charge storage film 4c composed of a metal oxide film such as a hafnium oxide film is formed on the bottom insulating film 4a by an ALCVD (Atomic Layer Chemical Vapor Deposition) method. The thickness of the charge storage film 4c is preferably 20 nm or less. This is because when the thickness of the charge storage film 4c is larger than 20 nm or more, the voltage for the writing and erasing operations of the memory cell becomes high, and this is confirmed also by an electric characteristic evaluation carried out with variously changing the film thickness of the hafnium oxide film by the inventors of the present invention.

A hafnium oxide film with a thickness of 20 nm or less is formed at a temperature of, for example, 285° C. with using tetra ethyl methyl amino hafnium ($Hf[N(CH_3)(C_2H_5)]_4$: TEMAHf) as a raw material of hafnium and using ozone as an oxidizing agent. In general, the ALCVD method is a film forming method in which a reaction cycle is repeatedly performed to successively form one atomic layer, thereby forming a high-quality film having an excellent step coverage, and the same growth rate can be maintained over the whole range where the raw material is absorbed. Therefore, the metal oxide film can be uniformly formed on the wafer surface with good reproducibility. As a raw material of hafnium, another material suitable for the ALCVD method can be used. As the oxidizing agent, water ($H_2O$) can also be used. Further, the hafnium oxide film can be formed not only by the ALCVD method but also by the CVD method, a sputtering method, and the like.

Next, in the same manner as the plasma nitriding treatment to the bottom insulating film 4a, the plasma nitriding treatment is performed to the charge storage film 4c, and the nitride region (the nitride region 4d shown in FIG. 2B described above) is formed on the upper surface side in the charge storage film 4c. As described above, the nitride region 4d has nitrogen concentration of 1 atom % or more, and the peak value of nitrogen concentration in the nitride region 4d is 5 atom % or more and 40 atom % or less.

Next, the top insulating film 4e with a thickness of 4 nm or more and 6 nm or less composed of, for example, a silicon oxide film is formed on the charge storage film 4c. The silicon oxide film can be formed by, for example, a low pressure CVD method using monosilane ($SiH_4$) gas and dinitrogen monoxide gas as raw materials. Alternatively, the silicon oxide film can be formed by the CVD method or the plasma CVD method using TEOS (Tetra Ethyl Ortho Silicate; $Si(OC_2H_5)_4$) as a raw material.

Next, a conductive film composed of, for example, a polycrystalline silicon film having impurity concentration of $5 \times 10^{20}$ atms/$cm^3$ is deposited on the top insulating film 4e. This conductive film is formed by the CVD method, and its thickness is, for example, 150 nm.

Next, as shown in FIG. 4, the conductive film is processed by a dry etching method with using a resist pattern as a mask, thereby forming a memory gate electrode 5. Furthermore, the charge holding insulating film 4 (the top insulating film 4e, the charge storage film 4c, and the bottom insulating film 4a) between the memory gate electrode 5 and the semiconductor substrate 1 is left and the charge holding insulating film 4 (the top insulating film 4e, the charge storage film 4c, and the bottom insulating film 4a) of the other regions is selectively removed by a dry etching method. Thereafter, in order to recover the damages of the sidewall shape of the memory gate electrode 5 due to the dry etching method, ISSG oxidation is performed to the semiconductor substrate 1, and a sidewall film 6 of 4 nm is formed on the sidewall of the memory gate electrode 5.

Next, as shown in FIG. 5, an n type impurity, for example, arsenic (As) is ion-implanted into the main surface of the semiconductor substrate 1 with using the memory gate electrode 5 as a mask, thereby forming n⁺ type semiconductor regions in the main surface of the semiconductor substrate 1 in a self-alignment manner to the memory gate electrode 5. The impurity ion implantation energy at this time is, for example, 40 keV, and the dose amount is, for example, 2×10¹⁵ atms/cm². Thereafter, for example, by applying heat treatment for 10 seconds at the temperature of 1000° C., the ion-implanted n type impurity is activated and a source region 3s and a drain region 3d are formed.

Next, an interlayer insulating film 7 is formed by, for example, the CVD method on the main surface of the semiconductor substrate 1. Subsequently, after forming a contact hole in the interlayer insulating film 7, a plug is formed inside the contact hole. Then, a first layer wiring M1 made of, for example, tungsten, aluminum or copper is formed on the interlayer insulating film 7, thereby almost completing the memory cell MC1. Subsequently, the semiconductor device is manufactured through a normal manufacturing process of the semiconductor device.

Next, the writing and erasing method of the MONOS memory cell with a single gate structure according to an embodiment of the present invention will be described with reference to FIG. 2 described above.

In the "writing", hot electrons are injected into the charge storage film 4c of the memory cell MC1. For example, the voltage (Vs) applied to the source region 3s is 0 V, the voltage (Vd) applied to the drain region 3d is 4 V, and the voltage (Vg) applied to the memory gate electrode 5 is 6 V.

The "erasing" is performed either by hot hole erasing (BTBT (Band-To-Band Tunneling) erasing) in which hot holes generated by band-to-band tunneling are accelerated with electric field and injected into the charge storage film 4c of the memory cell MC1 or by FN erasing in which holes are injected into the charge storage film 4c of the memory cell MC1 from the semiconductor substrate 1 by FN (Fowler-Nordheim) tunneling. When the BTBT erasing is performed, for example, the voltage (Vs) applied to the source region 3s is 0 V, the voltage (Vd) applied to the drain region 3d is 4 V, and the voltage (Vg) applied to the memory gate electrode 5 is −6 V. In the case of FN erasing, for example, the voltage (Vs) applied to the source region 3s is 0 V, the voltage (Vd) applied to the drain region 3d is 0 V, and the voltage (Vg) applied to the memory gate electrode 5 is −15 V. Note that the voltages for writing and erasing shown here are mere examples of the applying conditions and are not limited thereto, and they can be changed according to need.

Figure 6A:
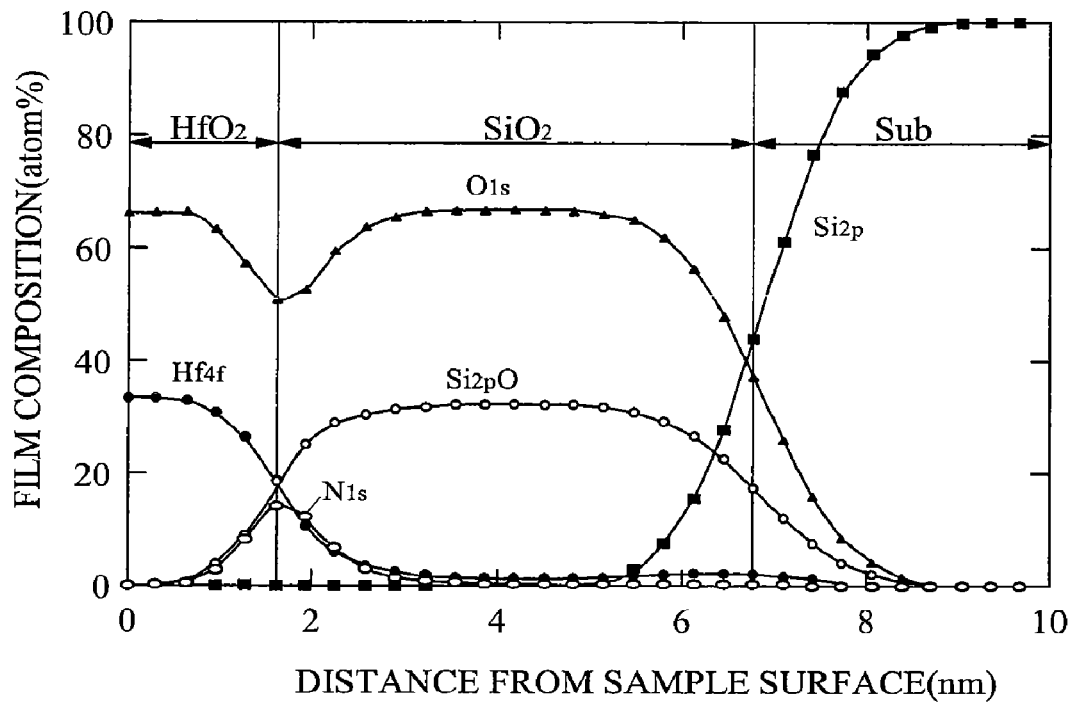
FIG. 6A is a graph showing a composition distribution in the thickness direction of a sample in which a nitride region is formed on an upper surface side in a silicon oxide film by a plasma nitriding treatment.
Figure 6B:
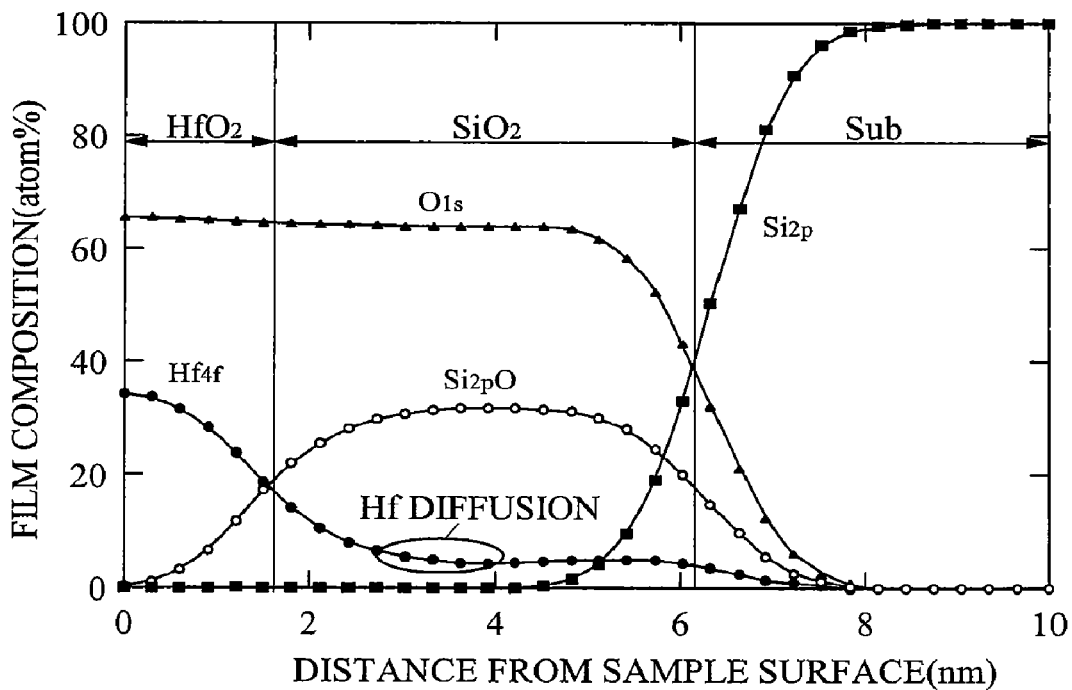
FIG. 6B is a graph showing a composition distribution in the thickness direction of a sample in which a nitride region is not formed in the silicon oxide film.

Next, the reaction between the bottom insulating film (silicon oxide film) and the charge storage film (hafnium oxide film) in the charge holding insulating film according to an embodiment of the present invention will be described with reference to FIG. 6. FIG. 6A is a graph showing a composition distribution in a film thickness direction in a sample in which the nitride region is formed by the plasma nitriding treatment on the hafnium oxide film side in the silicon oxide film. FIG. 6B is a graph showing a composition distribution in a film thickness direction in a sample in which the nitride region is not formed in the silicon oxide film. These composition distributions are obtained by X-ray photoelectron spectroscopy method (XPS method). In the sample whose composition distribution is shown in FIG. 6A, a hafnium oxide film is deposited after the plasma nitriding treatment is performed to the silicon oxide film formed on a silicon substrate, and then, the heat treatment is performed for one minute at the temperature of 950° C. In the sample whose composition distribution is shown in FIG. 6B, a hafnium oxide film is deposited without performing the plasma nitriding treatment to the silicon oxide film formed on the silicon substrate, and then, the heat treatment is performed for one minute at the temperature of 950° C. In this case, in order to increase the analytical sensitivity of the composition distribution, the thickness of the hafnium oxide film is set to 2 nm.

As shown in FIG. 6A, in the sample having the nitride region formed in the silicon oxide film, the diffusion of hafnium into the silicon oxide film is suppressed. In contrast to this, as shown in FIG. 6B, in the sample not having the nitride region formed in the silicon oxide film, hafnium is diffused approximately 5% in the silicon oxide film. From these results, it is apparent that the diffusion of hafnium into the silicon oxide film can be suppressed by forming the nitride region on the hafnium oxide film side in the silicon oxide film.

FIG. 6A show a result of composition analysis of the sample in which the nitride region is formed on the upper surface side in the silicon oxide film to be the bottom insulating film and a hafnium oxide film is stacked on the silicon oxide film to be the bottom insulating film. In addition, the inventors of the present invention have performed also a composition analysis of the sample in which the nitride region is formed on the upper surface side in the hafnium oxide film by performing the plasma nitriding treatment to the hafnium oxide film and a silicon oxide film to be the top insulating film is stacked on this hafnium oxide film. From the result of this composition analysis, it can be confirmed that the diffusion of hafnium into the silicon oxide film to be the top insulating film can be suppressed.

Next, the result of examination on the electric characteristics of the MONOS memory cell with the single gate structure according to an embodiment of the present invention will be described.

When a correlation between the treatment time of the plasma nitriding treatment to the bottom insulting film and the charge holding characteristic of the memory cell is examined, an experimental result showing that the charge holding characteristic of the memory cell can be improved when the treatment time of the plasma nitriding treatment is 30 seconds or more has been obtained. The pressure of the plasma nitriding treatment at this time is 50 Pa, and the power is 250 W.

Also, when a correlation between the thickness of the nitride region and the charge holding characteristic of the memory cell is examined while variously changing the nitriding conditions of the plasma nitriding treatment and controlling the thickness of the nitride region formed on the upper surface side of the bottom insulating film, an experimental result showing that the charge holding characteristic of the memory cell can be improved when the nitride region has the thickness of 0.5 nm or more and 1.5 nm or less has been obtained. Here, the nitride region indicates an insulating region made of silicon, nitrogen and oxygen, and the thickness of the nitride region is defined as a thickness of the region having the ratio of nitrogen concentration of 1 atom % or more.

Further, when a correlation between the peak position of nitrogen concentration and the charge holding characteristic of the memory cell is examined while variously changing the nitriding conditions of the plasma nitriding treatment and controlling the peak position of nitrogen concentration in the nitride region formed on the upper surface side of the bottom insulating film, an experimental result showing that the charge holding characteristic of the memory cell can be improved when the peak position of nitrogen concentration exists within 2 nm from an interface between the bottom insulating film and the charge storage film has been obtained.

Figure 7:
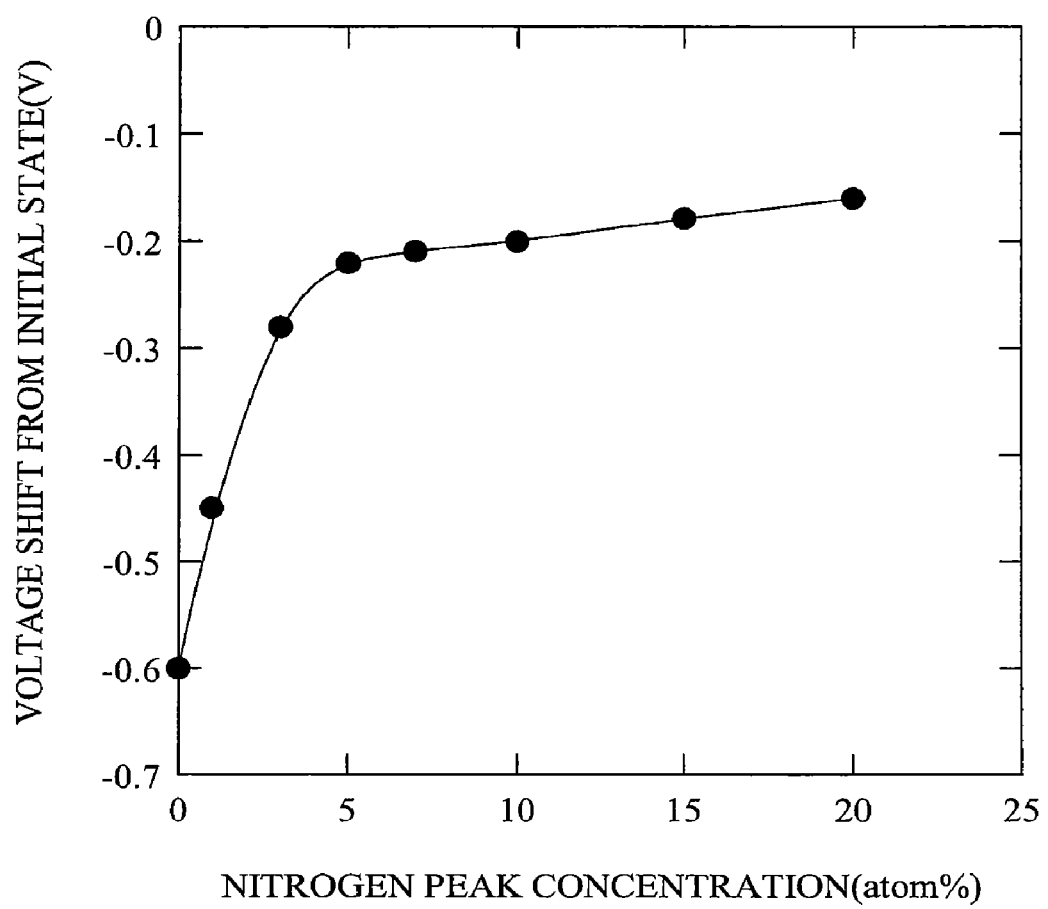
FIG. 7 is a graph for describing nitrogen concentration dependency of a charge holding characteristic of the MONOS memory cell according to an embodiment of the present invention.

Furthermore, a correlation between the nitrogen peak concentration and the charge holding characteristic of the memory cell is examined while variously changing the nitriding conditions of the plasma nitriding treatment and controlling the nitrogen peak concentration in the nitride region formed on the upper surface side of the bottom insulating film in the range of 0 to 40 atom %. FIG. 7 shows a graph for describing nitrogen concentration dependency of the charge holding characteristic of the memory cell. A longitudinal axis of FIG. 7 represents a voltage shift (variation from the initial state of the threshold voltage of the memory cell) of the memory cell from an initial state to a predetermined time, and a horizontal axis thereof represents nitrogen peak concentration in the nitride region in the bottom insulating film. The charge holding temperature is set to 150° C.

As shown in FIG. 7, although the voltage shift when nitrogen peak concentration in the nitride region of the bottom insulating film is 0 atom % is approximately −0.6 V, as the nitrogen peak concentration of nitrogen concentration in the bottom insulating film increases, the voltage shift decreases, and the voltage shift becomes approximately −0.22 V when the nitrogen peak concentration is 5 atom %, and the voltage shift becomes approximately −0.16 V when the nitrogen peak concentration is 20 atom %. As a result, it can be understood that the voltage shift can be suppressed when the nitrogen peak concentration of nitrogen concentration in the bottom insulating film is 5 atom % or more.

FIG. 7 shows an examination result of the correlation between the nitrogen peak concentration in the nitride region formed on the upper surface side in the bottom insulating film and the charge holding characteristic of the memory cell. In addition, the correlation between the nitrogen peak concentration and the charge holding characteristic of the memory cell is also examined while variously changing the nitriding conditions of the plasma nitriding treatment and controlling the nitrogen peak concentration in the nitride region formed on the upper surface side in the charge storage film in the range of 0 to 40 atom %. As a result, it becomes apparent that the voltage shift can be suppressed when the nitrogen peak concentration in the nitride region of the charge storage film is 5 atom % or more similarly to the case of the bottom insulating film.

Figure 8:
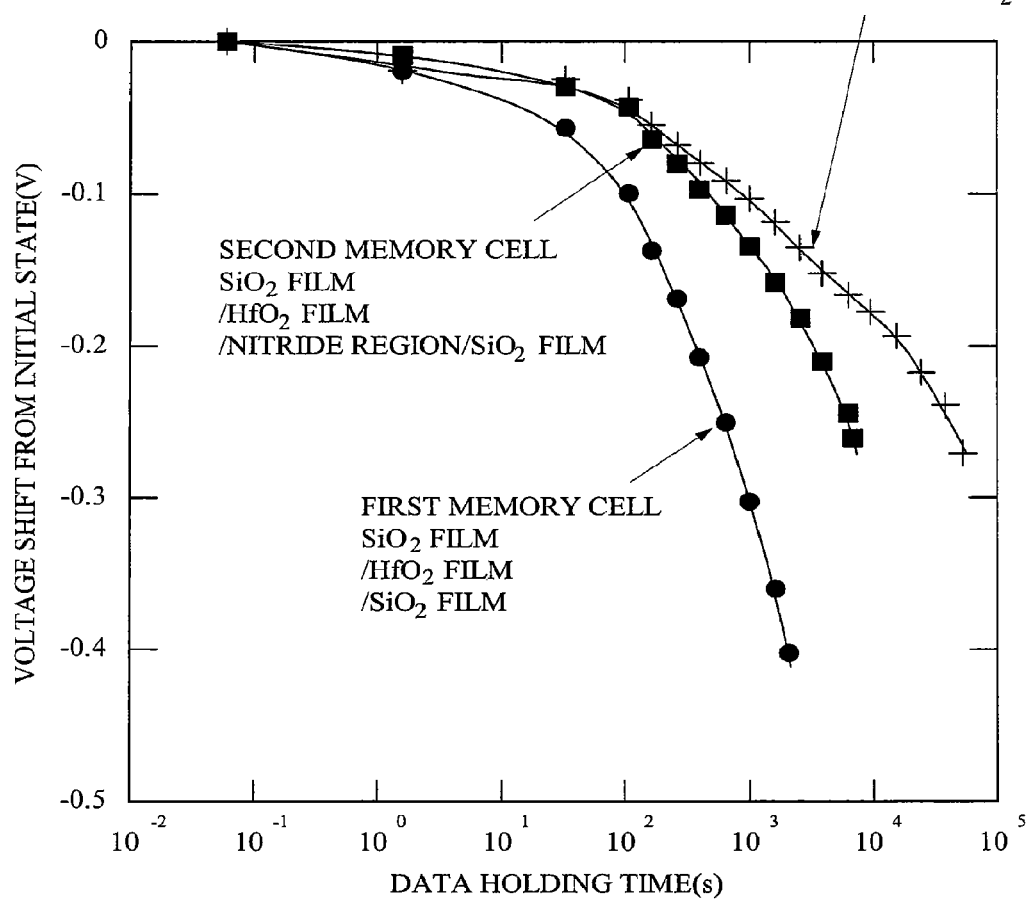
FIG. 8 is a graph for describing a difference in the charge holding characteristic depending on the presence or absence of the nitride region of the MONOS memory cell according to an embodiment of the present invention.

Also, the difference in charge holding characteristics of the memory cell depending on the presence and absence of the nitride region has been examined. FIG. 8 shows a graph for describing each charge holding characteristic of a first memory cell in which the nitride regions are not formed on the upper surface side in the bottom insulating film and the upper surface side in the charge storage film, a second memory cell in which the nitride region is formed only on the upper surface side of the bottom insulating film, and a third memory cell in which the nitride regions are formed on the upper surface side of the bottom insulating film and the upper surface side of the charge storage film, respectively. A longitudinal axis of FIG. 8 represents a voltage shift (variation from the initial state of the threshold voltage of the memory cell) of the memory cell from an initial state to a predetermined time, and a horizontal axis thereof represents a data holding time. The plasma nitriding treatment is performed only to the bottom insulating film in the second memory cell and the plasma nitriding treatment is performed to the bottom insulating film and the charge storage film in the third memory cell, respectively, and the nitrogen peak concentration of the nitride regions formed on the upper surface side in the bottom insulating film and the nitride region formed on the upper surface side in the charge storage film is 15 atom %. The bottom insulating film and the top insulting film are composed of silicon oxide films, and the charge storage film is composed of a hafnium oxide film.

As shown in FIG. 8, even in the second memory cell in which the nitride region is formed only on the upper surface side in the bottom insulating film, the charge holding characteristic can be significantly improved compared with the first memory cell in which the nitride region is not formed. Further, in the third memory cell in which the nitride regions are formed on the upper surface side in the bottom insulating film and the upper surface side in the charge storage film, respectively, the charge holding characteristic can be further improved compared with the second memory cell. However, the effect of improving the charge holding characteristic by the plasma nitriding treatment is considered to be larger in the case of forming the nitride region on the upper surface side in the bottom insulating film than in the case of forming the nitride region on the upper surface side in the charge storage film.

From the result of the experiment of the electric characteristics of the memory cell described above, it can be found that the charge holding characteristic of the memory cell can be improved by performing the plasma nitriding treatment to the bottom insulating film to form the nitride region on the upper surface side in the bottom insulating film in comparison with the case where the nitride region is not formed in the bottom insulating film. Further, it can also be found that the charge holding characteristic of the memory cell can be improved by performing the plasma nitriding treatment to the charge storage film to form the nitride region on the upper surface side in the charge storage film in comparison with the case where the nitride region is not formed in the charge storage film. Furthermore, it can also be found that the charge holding characteristic of the memory cell can be further improved by performing the plasma nitriding treatment to the bottom insulating film and the charge storage film to form the nitride regions on the upper surface side in the bottom insulating film and on the upper surface side in the charge storage film in comparison with the case where the nitride region is formed only on the upper surface side in the bottom insulating film.

In this manner, according to the present embodiment, in the charge holding insulating film constituted by sequentially stacking the bottom insulating film, the charge storage film composed of a metal oxide film and the top insulating film, the plasma nitriding treatment is performed to the bottom insulating film, thereby forming the nitride region whose nitrogen concentration has a peak value and is 1 atom % or more on the upper surface side in the bottom insulating film (the thickness of the nitride region is 0.5 nm or more and 1.5 nm or less, the peak value of nitrogen concentration in the nitride region is 5 atom % or more and 40 atom % or less, and a position of the peak value of nitrogen concentration in the nitride region is within 2 nm from the upper surface), so that the diffusion of the metal elements from the charge storage film to the bottom insulating film can be suppressed, and thus the charge holding characteristic of the memory cell can be improved. Similarly, in the charge holding insulating film, the plasma nitriding treatment is performed to the charge storage film, thereby forming the nitride region whose nitrogen concentration has a peak value and nitrogen concentration is 1 atom % or more on the upper surface side in the charge storage film (the peak value of nitrogen concentration in the nitride region is 5 atom % or more and 40 atom % or less), so that the diffusion of the metal elements from the charge storage film to the top insulating film can be suppressed, and thus the charge holding characteristic of the memory cell can be improved.

Alternatively, when the heat treatment is performed in a nitriding atmosphere such as nitrogen monoxide, dinitrogen monoxide or ammonium atmosphere, nitrogen is not segregated on the upper surface side in the bottom insulating film, but nitrogen is segregated at the interface between the semiconductor substrate and the bottom insulating film, and therefore, it is not possible to suppress the diffusion of hafnium to the bottom insulating film. However, by adopting the plasma nitriding treatment, nitrogen can be segregated only on the upper surface side in the bottom insulating film, and therefore, the diffusion of the metal elements can be efficiently suppressed. Also, by adopting the plasma nitriding treatment, as compared with the CVD method, nitrogen concentration and the thickness of the nitride region can be uniformly and easily controlled on the surface of a wafer. Further, the nitride region can be formed to have relatively small thickness such as 1.5 nm or less.

In the present embodiment, the case where the present invention is applied to the MONOS memory cell with a single gate structure has been described. However, the embodiment is not limited to this, and for example, the invention can be applied also to the MONOS memory cell with a split gate structure formed of a selection nMIS and a memory nMIS, and the same effect can be obtained. Also, the MONOS memory cell can be mounted on the same silicon substrate as a logic semiconductor device, and a high-performance semiconductor device can be realized.

Figure 9:
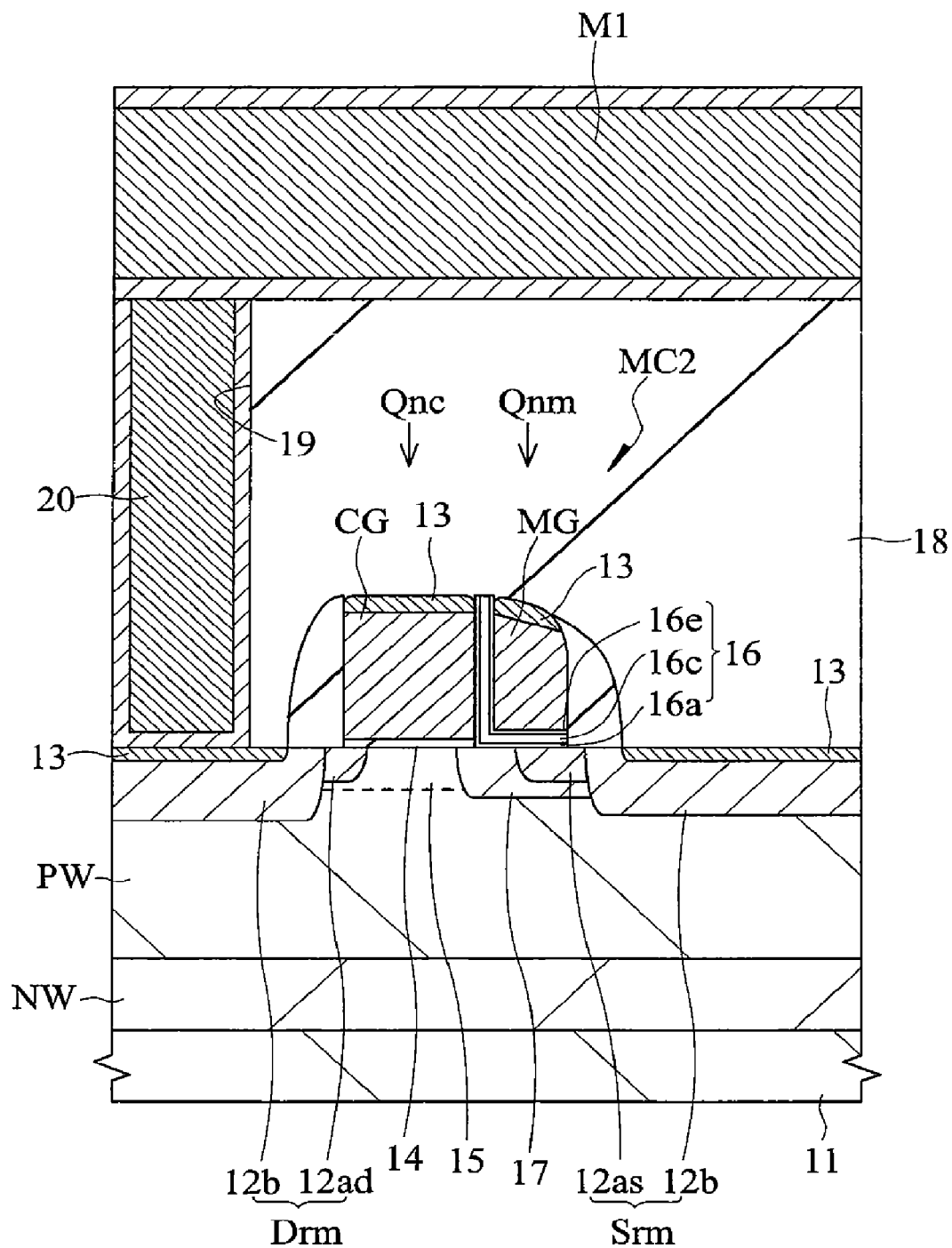
FIG. 9 is a cross sectional view showing the principal part of a memory cell in which the MONOS memory cell with the split gate structure (memory gate electrode sidewall structure) is cut along a gate length direction according to an embodiment of the present invention.
Figure 10:
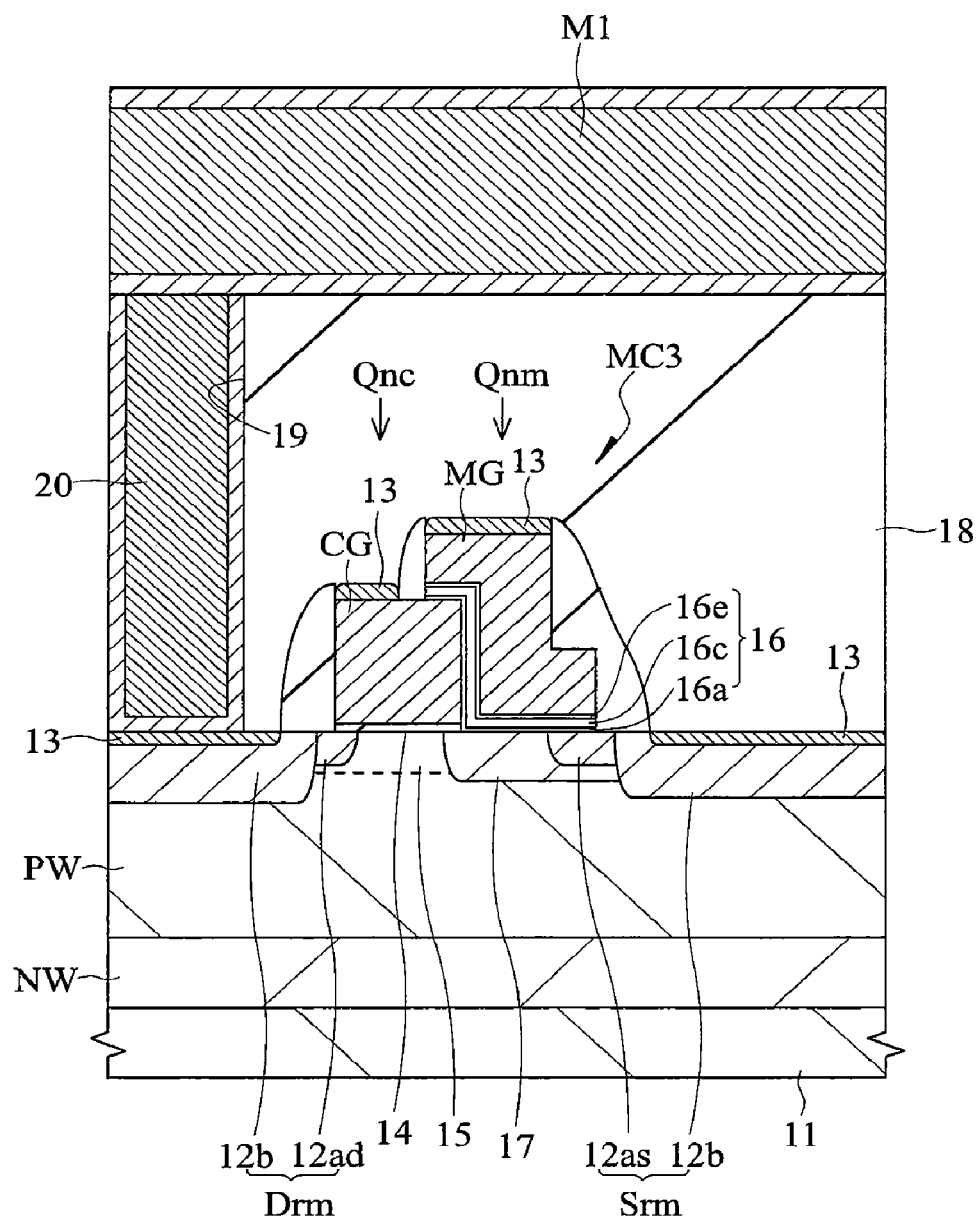
FIG. 10 is a cross sectional view showing the principal part of a memory cell in which the MONOS memory cell with the split gate structure (memory gate electrode overlying structure) is cut along a gate length direction according to an embodiment of the present invention.

An example of the MONOS memory cell with the split gate structure is shown in FIGS. 9 and 10. FIGS. 9 and 10 are cross sectional views showing the principal part of the memory cell in which the MONOS memory cell with the split gate structure is cut along the gate length direction.

In a memory cell MC2 shown in FIG. 9, the selection nMIS (Qnc) and the memory nMIS (Qnm) are disposed in an active region of the main surface (device forming surface) of a semiconductor substrate 11. For example, the drain region Drm and the source region Srm of this memory cell MC2 have an n⁻ type semiconductor region 12ad or an n⁻ type semiconductor region 12as with relatively low concentration and an n⁺ type semiconductor region 12b with relatively high concentration whose impurity concentration is higher than that of the n⁻ type semiconductor regions 12ad and 12as (LDD (Lightly Doped Drain) structure). The n⁻ type semiconductor regions 12ad and 12as are disposed on the channel region side of the memory cell MC2, and the n⁺ type semiconductor region 12b is disposed at a position separated from the channel region side of the memory cell MC2 by the n⁻ type semiconductor regions 12ad and 12as. In FIG. 9, a reference symbol NW denotes an n well, and a symbol PW denotes a p well.

On the main surface of the semiconductor substrate 11 between the drain region Drm and the source region Srm, a selection gate electrode CG of the selection nMIS (Qnc) and a memory gate electrode MG of the memory nMIS (Qnm) extend adjacently. The selection gate electrode CG is disposed in a first region of the main surface of the semiconductor substrate 11, and the memory gate electrode MG is disposed in a second region different from the first region of the main surface of the semiconductor substrate 11. The selection gate electrode CG is composed of, for example, an n type polycrystalline silicon film, and its gate length is, for example, 100 to 200 nm. The memory gate electrode MG is composed of, for example, an n type polycrystalline silicon film, and its gate length is, for example, 50 to 150 nm.

A silicide layer 13 such as cobalt silicide, nickel silicide, and titanium silicide is formed on the upper surfaces of the selection gate electrode CG, the memory gate electrode MG, and the n⁺ type semiconductor regions 12b constituting a part of the source region Srm and the drain region Drm. The thickness of the silicide layer 13 is, for example, 20 nm.

A gate insulating film 14 composed of a thin silicon oxide film with a thickness of, for example, 1 to 5 nm is provided between the selection gate electrode CG and the main surface of the semiconductor substrate 11. In the main surface of the semiconductor substrate 11 below the gate insulating film 14, for example, boron (B) is introduced and a p type semiconductor region 15 is formed. This semiconductor region 15 is a semiconductor region for forming the channel of the selection nMIS (Qnc), and a threshold voltage of the selection nMIS (Qnc) is set to a predetermined value by this semiconductor region 15.

The memory gate electrode MG is provided on one side of a sidewall of the selection gate electrode CG, and insulation between the selection gate electrode CG and the memory gate electrode MG is ensured by a charge holding insulating film 16 constituted by stacking a bottom insulating film 16a, a charge storage film 16c, and a top insulating film 16e. Further, the memory gate electrode MG is disposed on the second region of the semiconductor substrate 11 through the charge holding insulating film 16.

The charge holding insulating film 16 is the same as the charge holding insulating film 4 described with reference to FIG. 2. More specifically, the film 16 is constituted by sequentially stacking the bottom insulating film 16a, the charge storage film 16c, and the top insulating film 16e from the channel region side, and the bottom insulating film 16a and the top insulating film 16e are composed of, for example, silicon oxide films and the charge storage film 16c is composed of, for example, a metal oxide film such as a hafnium oxide film. The thickness of the bottom insulating film 16a and the top insulating film 16e is 4 nm or more and 6 nm or less, and the thickness (physical film thickness) of the charge storage film 16c is 20 nm or less. Also, the nitride region whose nitrogen concentration has a peak value and is 1 atom % or more is formed on the charge storage film 16c side in the bottom insulating film 16a, and the thickness of the nitride region is 0.5 nm or more and 1.5 nm or less. Further, the peak value of nitrogen concentration in the nitride region is 5 atom % or more and 40 atom % or less, and it is located within 2 nm from the interface between the bottom insulating film 16a and the charge storage film 16c. Furthermore, the nitride region whose nitrogen concentration has a peak value and is 1 atom % or more can be formed also on the top insulating film 16e side in the charge storage film 16c. In this case, the peak value of nitrogen concentration in the nitride region is set to 5 atom % or more and 40 atom % or less.

In the main surface of the semiconductor substrate 11 below the bottom insulating film 16a and between the p type semiconductor region 15 and the source region Srm, for example, arsenic or phosphor (P) is introduced and an n type semiconductor region 17 is formed. This semiconductor region 17 is a semiconductor region for forming the channel of the memory nMIS (Qnm), and the threshold voltage of the memory nMIS (Qnm) is set to a predetermined value by this semiconductor region 17.

The memory cell MC2 is covered with an interlayer insulating film 18. A first layer wiring M1 extending in a second direction which is a direction intersecting with the memory gate electrode MG (or selection gate electrode CG) extending in a first direction is connected to the drain region Drm through a plug 20 embedded in a contact hole 19 formed in the interlayer insulating film 18. This wiring M1 constitutes a bit line of each memory cell MC2.

A memory cell MC3 shown in FIG. 10 has the same charge holding insulating film as the memory cell MC2 describe above, but the shape of the memory gate electrode MG of the memory nMIS (Qnm) and its formation method are different from those of the memory cell MC2. More specifically, the memory cell MC2 adopts a memory gate electrode sidewall structure in which the memory gate electrode MG of the memory nMIS (Qnm) is formed on a sidewall of the selection gate electrode CG of the selection nMIS (Qnc) in a self-alignment manner. On the other hand, the memory cell MC3 adopts a memory gate electrode overlying structure in which a part of the memory gate electrode MG of the memory nMIS (Qnm) is overlain on the selection gate electrode CG of the selection nMIS (Qnc), and the selection gate electrode CG and the memory gate electrode MG are processed by using a resist pattern formed by lithography technology, respectively. Since the memory cell MC3 has approximately the same configuration as the memory cell MC2 except the memory gate electrode MG of the memory nMIS (Qnm), the description thereof will be omitted.

Although the memory gate electrode overlying structure in which a part of the memory gate electrode MG of the memory nMIS (Qnm) is overlain on the selection gate electrode CG of the selection nMIS (Qnc) has been adopted in the memory cell MC3, it is also possible to adopt the memory gate electrode overlying structure in which a part of the selection gate electrode CG of the selection nMIS (Qnc) is overlain on the memory gate electrode MG of the memory nMIS (Qnm).

In the foregoing, the invention made by the inventors of the present invention has been concretely described based on the embodiments. However, it is needless to say that the present invention is not limited to the foregoing embodiments and various modifications and alterations can be made within the scope of the present invention.

For example, in the present embodiment, a hafnium oxide film which is a metal oxide film has been used for the charge storage film of the charge holding insulating film, but the charge storage film is not limited to the hafnium oxide film, and for example, a metal oxide film such as an alumina film, a zirconium oxide film, a tantalum oxide film, a yttrium oxide film, or a lanthanum oxide film can be used. Further, it is also possible to use so-called silicate oxide films obtained by adding silicon to these metal oxide films (for example, hafnium silicate, zirconium silicate, aluminum silicate, and the like) and aluminate oxide films obtained by adding aluminum thereto (for example, hafnium aluminate, zirconium aluminate, and the like). Furthermore, it is also possible to use the oxide film in which a plurality of metal oxide films are mixed (for example, the oxide film in which hafnium and lanthanum are mixed, and the like).

The present invention can be applied to a semiconductor storage device having a nonvolatile memory cell in which the electric charge is stored in a metal oxide film.

What is claimed is:

1. A manufacturing method of a nonvolatile semiconductor storage device comprising the steps of:
    (a) forming a first insulating film on a semiconductor substrate;
    (b) performing a plasma nitriding treatment to the first insulating film, thereby forming a nitride region whose nitrogen concentration has a peak value and is 1 atom % or more on an upper surface side in the first insulating film;
    (c) forming a charge storage film composed of a metal oxide film on the first insulating film;
    (d) forming a second insulating film on the charge storage film; and
    (e) forming a gate electrode on the second insulating film,
    wherein a thickness of the nitride region is 0.5 nm or more and 1.5 nm or less.

2. The manufacturing method of a nonvolatile semiconductor storage device according to claim 1,
    wherein a treatment time of the plasma nitriding treatment in the step (b) is 30 seconds or more.

3. The manufacturing method of a nonvolatile semiconductor storage device according to claim 1,
    wherein the peak value of nitrogen concentration in the first insulating film is 5 atom % or more and 40 atom % or less.

4. The manufacturing method of a nonvolatile semiconductor storage device according to claim 1,
    wherein the peak value of nitrogen concentration is located in an area within 2 nm from an interface between the first insulating film and the charge storage film.

5. The manufacturing method of a nonvolatile semiconductor storage device according to claim 1,
    wherein physical thickness of the charge storage film is 20 nm or less.

6. The manufacturing method of a nonvolatile semiconductor storage device according to claim 1,
    wherein the charge storage film is formed by an ALCVD method.

7. The manufacturing method of a nonvolatile semiconductor storage device according to claim 1, further comprising a step of:
    (f) between the step (c) and the step (d), performing plasma nitriding treatment to the charge storage film, thereby forming a nitride region whose nitrogen concentration has a peak value and is 1 atom % or more on an upper surface side in the charge storage film.

8. The manufacturing method of a nonvolatile semiconductor storage device according to claim 7,
    wherein the peak value of nitrogen concentration in the charge storage film is 5 atom % or more and 40 atom % or less.

* * * * *